US011048171B2

(12) United States Patent
Shirakawa et al.

(10) Patent No.: US 11,048,171 B2
(45) Date of Patent: Jun. 29, 2021

(54) CONVEYING TYPE WASHING DEVICE

(71) Applicant: FUJIFILM Corporation, Tokyo (JP)

(72) Inventors: Masato Shirakawa, Shizuoka (JP);
Toshihiro Watanabe, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/801,120

(22) Filed: Feb. 25, 2020

(65) Prior Publication Data

US 2020/0192226 A1 Jun. 18, 2020

Related U.S. Application Data

(63) Continuation of application No. PCT/JP2018/028420, filed on Jul. 30, 2018.

(30) Foreign Application Priority Data

Aug. 30, 2017 (JP) .............................. JP2017-165771

(51) Int. Cl.
*G03F 7/30* (2006.01)
*G03F 7/20* (2006.01)

(52) U.S. Cl.
CPC ............ *G03F 7/305* (2013.01); *G03F 7/2012* (2013.01); *G03F 7/3057* (2013.01)

(58) Field of Classification Search
CPC ....... G03F 7/305; G03F 7/3057; G03F 7/2012
See application file for complete search history.

(56) References Cited

U.S. PATENT DOCUMENTS

| | | | | | |
|---|---|---|---|---|---|
| 4,410,562 | A | * | 10/1983 | Nemoto | ................. B41M 3/008 427/259 |
| 4,428,659 | A | * | 1/1984 | Howard | .................. G03F 7/305 396/611 |
| 5,425,840 | A | * | 6/1995 | Ferrante | .................. G03F 7/305 156/345.11 |
| 5,828,923 | A | * | 10/1998 | Harabin | .................. C02F 1/283 396/626 |
| 6,126,336 | A | * | 10/2000 | Ferrante | .................... G03F 7/30 210/121 |

(Continued)

FOREIGN PATENT DOCUMENTS

| | | |
|---|---|---|
| EP | 0982627 | 3/2000 |
| EP | 1788442 | 5/2007 |

(Continued)

OTHER PUBLICATIONS

"International Search Report (Form PCT/ISA/210) of PCT/JP2018/028420," dated Sep. 11, 2018, with English translation thereof, pp. 1-5.

(Continued)

*Primary Examiner* — Steven Whitesell Gordon
(74) *Attorney, Agent, or Firm* — JCIPRNET

(57) ABSTRACT

Provided is a conveying type washing device capable of achieving both maintainability and productivity. This conveying type washing device develops a flexographic printing plate precursor after imagewise exposure using a washing solution. The conveying type washing device has a conveying unit that conveys the flexographic printing plate precursor through a conveying path including a curved conveying path, and a development unit that develops the flexographic printing plate precursor in a state in which the flexographic printing plate precursor is immersed in the washing solution by the conveying unit and conveyed.

15 Claims, 5 Drawing Sheets

(56) References Cited

U.S. PATENT DOCUMENTS

| | | | |
|---|---|---|---|
| 6,152,618 A | 11/2000 | Jensen et al. | |
| 6,224,273 B1* | 5/2001 | Ferrante | G03F 7/3092 210/122 |
| 6,247,856 B1* | 6/2001 | Shibano | G03F 7/3092 396/565 |
| 8,182,980 B2* | 5/2012 | Adachi | G03F 7/0325 430/302 |
| 2012/0115091 A1* | 5/2012 | Suzuki | B01D 29/56 430/449 |
| 2019/0204745 A1* | 7/2019 | Aviel | G03F 7/322 |

FOREIGN PATENT DOCUMENTS

| | | |
|---|---|---|
| EP | 2103994 | 9/2009 |
| JP | H08123041 | 5/1996 |
| JP | H09304941 | 11/1997 |
| JP | 2000010264 | 1/2000 |
| JP | 2001005194 | 1/2001 |
| JP | 2001516470 | 9/2001 |
| JP | 2005345502 | 12/2005 |
| JP | 2009058750 | 3/2009 |
| JP | 5683029 | 3/2015 |
| WO | 9844389 | 10/1998 |

OTHER PUBLICATIONS

"International Preliminary Report on Patentability (Form PCT/IPEA/409) of PCT/JP2018/028420," completed on Jul. 17, 2019, with English translation thereof, pp. 1-8.

"Search Report of Europe Counterpart Application", dated Oct. 2, 2020, p. 1-p. 9.

* cited by examiner

CONVEYING TYPE WASHING DEVICE

CROSS-REFERENCE TO RELATED APPLICATIONS

This application is a Continuation of PCT International Application No. PCT/JP2018/028420 filed on Jul. 30, 2018, which claims priority under 35 U.S.C. § 119(a) to Japanese Patent Application No. 2017-165771 filed on Aug. 30, 2017. Each of the above applications is hereby expressly incorporated by reference, in its entirety, into the present application.

BACKGROUND OF THE INVENTION

1. Field of the Invention

The present invention relates to a conveying type washing device that develops a flexographic printing plate precursor after imagewise exposure using a washing solution, and particularly to a conveying type washing device that develops a flexographic printing plate precursor in a state in which the flexographic printing plate precursor is immersed in a washing solution and conveyed.

2. Description of the Related Art

Various methods for developing a printing plate are known as a method of developing a printing plate using a photosensitive resin plate. For example, in a development method in which development is performed using an aqueous developer including water as a main component, development is performed by washing out an uncured resin, which is an unexposed portion, with a brush or the like while applying the aqueous developer to a photosensitive resin plate after imagewise exposure.

JP5683029B discloses a flexographic photosensitive resin plate making device comprising a cleaning unit including a cleaning zone for removing an uncured portion of a photosensitive resin plate and a rinsing zone that is provided adjacent to the cleaning zone for cleaning a surface of the photosensitive resin plate from which the uncured portion is removed in the cleaning zone, and a conveying unit for conveying the photosensitive resin plate, which is provided below the cleaning unit. The cleaning zone includes a cleaning brush unit having one or more cleaning brushes and a cleaning brush unit driving mechanism that drives the cleaning brush unit in a horizontal direction. The rinsing zone includes a rotary brush unit having one or more rotary brushes, and the bristles of the rotary brushes are arranged in a spiral shape. The conveying unit includes an endless belt having fixing means for fixing the photosensitive resin plate, and an endless belt driving mechanism that moves the endless belt in the horizontal direction below the cleaning unit. JP5683029B has a configuration called a horizontal conveying type.

A photosensitive resin printing plate developing machine disclosed in JP1996-304941A (JP-H09-304941A) includes a washing tank, developing brushes some or all of which are present in the washing tank, and a photosensitive resin plate material fixing tool that is present opposite to the tips of the developing brushes, and the developing brush is formed of polybutylene terephthalate. The photosensitive resin printing plate developing machine of JP1996-304941A (JP-H09-304941A) performs development in a state in which the developing brushes are immersed in a developer.

SUMMARY OF THE INVENTION

In JP5683029B, since the cleaning unit corresponding to a developing unit is an open type, a step of wetting the cleaning brush with a developer and a step of drying the developer adhering to the cleaning brush in the air are repeated, and the development scum is easily fixed to the cleaning brush. Therefore, in JP5683029B, it is necessary to remove the development scum fixed to the cleaning brush and there is a problem that the maintenance load is large.

The photosensitive resin printing plate developing machine of JP1996-304941A (JP-H09-304941A) has a configuration called a clam shell type, and performs development by batch processing. Therefore, there is a problem that development cannot be performed continuously and the productivity is low. As described above, currently, there is no device that achieves both maintainability and productivity.

An object of the present invention is to solve the above-described problems based on the related arts and provide a conveying type washing device capable of achieving both maintenance and productivity.

In order to achieve the above object, the present invention provides a conveying type washing device that develops a flexographic printing plate precursor after imagewise exposure using a washing solution, including a conveying unit that conveys the flexographic printing plate precursor through a conveying path including a curved conveying path; and a development unit that develops the flexographic printing plate precursor in a state in which the flexographic printing plate precursor is immersed in the washing solution by the conveying unit and conveyed.

It is preferable that the development unit has a brush used for development, the brush is arranged in the washing solution, and the development is performed by removing an unexposed portion of the flexographic printing plate precursor by the brush.

It is preferable that the washing solution is an aqueous developer.

It is preferable that the conveying unit adopts at least one of a belt conveying system, a roller conveying system, a gear conveying system, or a guide conveying system.

It is preferable that the conveying type washing device further includes a processing unit that removes solids that are generated by removing an unexposed portion of the flexographic printing plate precursor by the development using the washing solution in a development fatigue liquid including the solids.

It is preferable that the processing unit has at least one of a centrifuge or a separation membrane for removing the solids in the development fatigue liquid.

According to the present invention, it is possible to provide a conveying type washing device having excellent maintainability and high productivity and capable of achieving both maintainability and productivity.

DESCRIPTION OF THE PREFERRED EMBODIMENTS

Hereinafter, a conveying type washing device according to an embodiment of the present invention will be described in detail based on the preferred embodiments shown in the accompanying drawings.

In addition, the drawings described below are illustrations for describing the present invention, and this invention is not limited to the drawings shown below.

In the following, "to" indicating a numerical range includes numerical values on both sides. For example, when ε is a numerical value α to a numerical value β, the range of ε is a range including the numerical value α and the numerical value β, and it is expressed as $\alpha \leq \varepsilon \leq \beta$ in mathematical symbols.

In addition, regarding numerical values and the like, unless otherwise specified, an error range generally allowed in the corresponding technical field is included.

Figure 1:
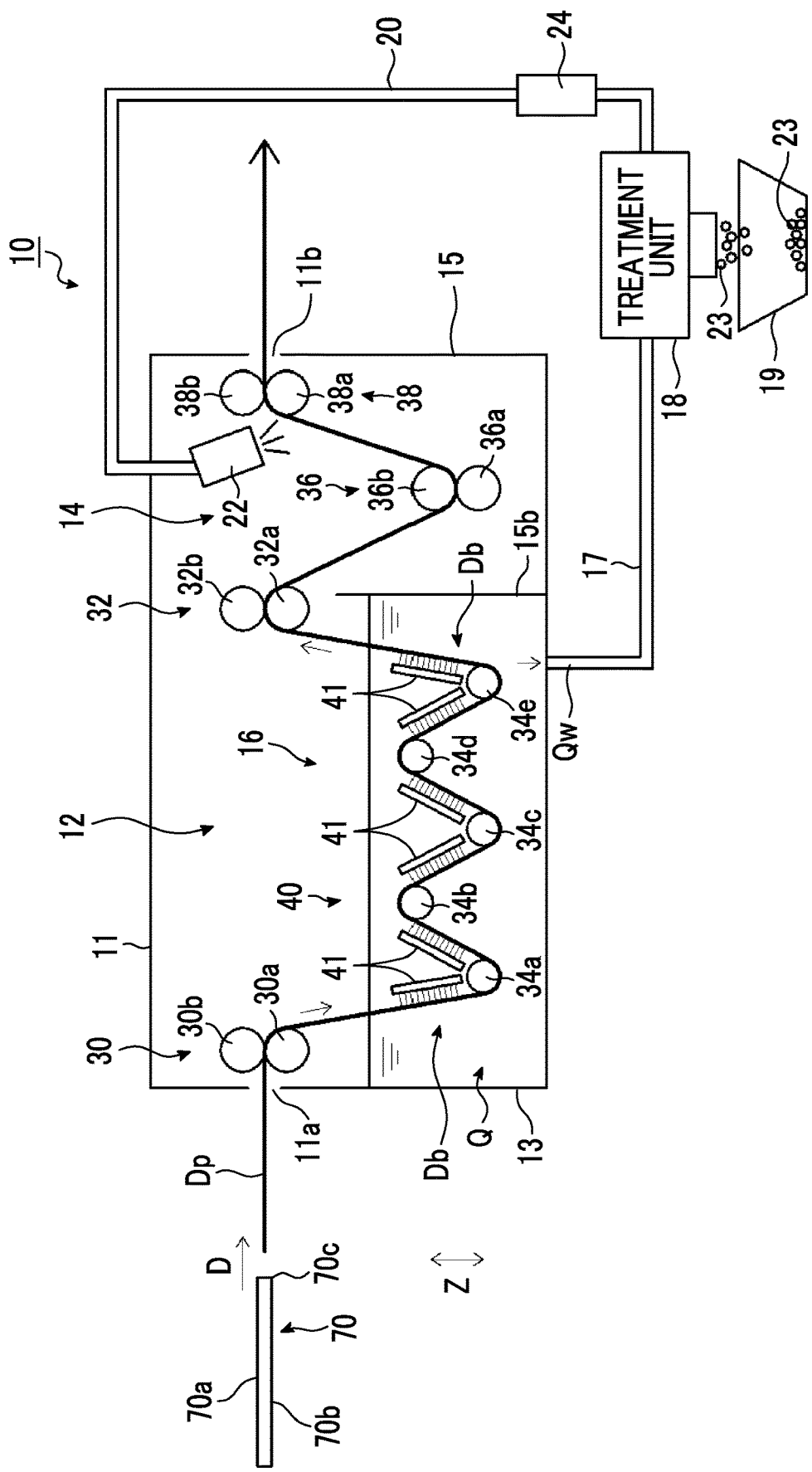
FIG. 1 is a schematic view showing a first example of a conveying type washing device according to an embodiment of the present invention.

FIG. 1 is a schematic view showing a first example of a conveying type washing device according to an embodiment of the present invention.

A conveying type washing device 10 shown in FIG. 1 develops a flexographic printing plate precursor 70 after imagewise exposure, which is exposed imagewise on a front surface 70a, using a washing solution Q. Performing development using the above-described washing solution Q is called a development step. Reference Dp in FIG. 1 indicates a conveying path of the flexographic printing plate precursor 70.

As will be described later, the flexographic printing plate precursor 70 is as thin as several millimeters, and is flexible enough to be conveyed zigzag in a developing tank 13. In addition, the imagewise exposure to the front surface 70a of the flexographic printing plate precursor 70 is performed using, for example, an exposure device (not shown). The imagewise exposed front surface 70a of the flexographic printing plate precursor 70 is a printing surface.

In the conveying type washing device 10, on the flexographic printing plate precursor 70 after imagewise exposure in a state in which the flexographic printing plate precursor is immersed in the washing solution Q and conveyed, an unexposed portion (not shown) of the flexographic printing plate precursor 70 is removed and development is performed. The conveying type washing device 10 is not a device that performs development by batch processing, but is a single sheet type device that performs development while conveying the flexographic printing plate precursor 70.

The conveying type washing device 10 has a developing unit 12 and a rinsing unit 14. For example, the developing unit 12 and the rinsing unit 14 are provided side by side in one housing 11, the developing unit 12 is arranged on an inlet 11a side of the housing 11, and the rinsing unit 14 is arranged on an outlet 11b of the housing 11. Further, the conveying type washing device 10 has a processing unit 18 provided in the developing tank 13 through a connection pipe 17.

The developing unit 12 of the conveying type washing device 10 has the developing tank 13, and a conveying unit 16 which conveys the flexographic printing plate precursor 70 through a conveying path Dp including a curved conveying path Db. The developing tank 13 is a container in which the washing solution Q is stored.

The conveying unit 16 conveys the flexographic printing plate precursor 70 through the conveying path Dp including the curved conveying path Db as described above, and has a pair of first conveying rollers 30 arranged on an upstream side in a conveying direction D in which the flexographic printing plate precursor 70 is conveyed, and a pair of second conveying rollers 32 arranged on a downstream side in the conveying direction D. The pair of first conveying rollers 30 and the pair of second conveying rollers 32 are provided, for example, above the developing tank 13 at the same height.

By the conveying unit 16, the flexographic printing plate precursor 70 is conveyed in the developing tank 13 in a state of being immersed in the washing solution Q.

The upstream side in the conveying direction D is the inlet 11a side of the housing 11, and the downstream side in the conveying direction D is the outlet 11b side of the housing 11.

The pair of first conveying rollers 30 has a roller 30a arranged on a back surface 70b side of the flexographic printing plate precursor 70 and a roller 30b arranged on the front surface 70a side of the flexographic printing plate precursor 70, and conveys the flexographic printing plate precursor 70 with the flexographic printing plate precursor 70 interposed therebetween. One of the roller 30a and the roller 30b described above is a driving roller and the other is a driven roller.

Similarly to the pair of first conveying rollers 30, the pair of second conveying rollers 32 has a roller 32a arranged on the back surface 70b side of the flexographic printing plate precursor 70 and a roller 32b arranged on the front surface 70a side of the flexographic printing plate precursor 70, and conveys the flexographic printing plate precursor 70 with the flexographic printing plate precursor interposed therebetween. One of the roller 32a and the roller 32b described above is a driving roller and the other is a driven roller.

The conveying unit 16 has a plurality of guide rollers 34a, 34b, 34c, 34d, and 34e which are arranged between the pair of first conveying rollers 30 and the pair of second conveying rollers 32 and in the developing tank 13 and guide the flexographic printing plate precursor 70. The guide rollers 34a, 34b, 34c, 34d, and 34e are alternately arranged by changing the positions with respect to a direction Z alternately. Thus, the flexographic printing plate precursor 70 is conveyed zigzag in the developing tank 13. The number of guide rollers is appropriately determined according to the size of the developing tank 13, the size of the flexographic printing plate precursor 70, and the like.

Curving and conveying the flexographic printing plate precursor 70 like the conveying path Db to immerse the flexographic printing plate precursor 70 in the washing solution Q in the developing tank 13 is referred to as curvedly conveying the flexographic printing plate precursor 70.

As the guide rollers 34a, 34b, 34c, 34d, 34e, for example, it is preferable to use a rubber roller, a sponge roller, or the like so as not to damage the printing surface, that is, the front surface 70a of the flexographic printing plate precursor 70.

In addition, a development unit 40 that develops the flexographic printing plate precursor 70 in a state in which the flexographic printing plate precursor is immersed in the washing solution Q in the developing tank 13 and conveyed is provided.

In the developing unit 12, a development fatigue liquid Qw is generated in the developing tank 13 by development by the development unit 40. The development fatigue liquid Qw is the washing solution Q including solids generated by removing an unexposed portion (not shown) of the flexographic printing plate precursor 70 by the development using the washing solution Q.

The development unit 40 has, for example, a plurality of brushes 41. The plurality of brushes 41 are used in development, immersed in the washing solution Q and arranged on the front surface 70a side of the flexographic printing plate precursor 70 in the conveying direction D in the developing tank 13.

In a state in which the flexographic printing plate precursor 70 is conveyed, the front surface 70a of the flexographic printing plate precursor 70 is rubbed by the plurality of brushes 41, the unexposed portion (not shown) of the flexographic printing plate precursor 70 is removed, and development is performed. The above development fatigue liquid Qw is generated during this development.

Since the plurality of brushes 41 are immersed in the washing solution Q and arranged, the washing solution Q adhering to the brushes 41 is not dried, and the unexposed portion removed by the brushes 41 or the like is prevented from being fixed to the brushes 41 as development scum.

As the brush 41, for example, a brush with a bunch of bristles perpendicular to a substrate is used. The brush 41 is called a flat brush. In this configuration, the bristles of the brush 41 are substantially perpendicular to the front surface 70a of the flexographic printing plate precursor 70. The configuration of the brush 41 is not particularly limited to the configuration of the above-described flat brush or the like.

The material of the bristles of the brush 41 is not particularly limited. For example, known materials used for the development of the flexographic printing plate precursor 70 such as nylon 6,6, nylon 610, polybutylene terephthalate (PBT), or polyethylene terephthalate (PET) can be appropriately used.

The brush 41 may be stationary with respect to the front surface 70a of the flexographic printing plate precursor 70, that is, may be fixed, or may be configured to move with respect to the front surface 70a of the flexographic printing plate precursor 70. In this case, the movement of the brush 41 is not particularly limited, and may be any of rotation, reciprocation, or a combination of rotation and reciprocation.

In a case where the brush 41 moves, the brush 41 may always move during development, or may move only when the flexographic printing plate precursor 70 is conveyed to the developing tank 13. In this case, for example, it is possible to perform development by providing a sensor for detecting the flexographic printing plate precursor 70 in the pair of first conveying roller pairs 30, and specifying the time to reach the brush 41 by using the conveying timing and conveying speed of the flexographic printing plate precursor 70 to move the brush 41.

The rinsing unit 14 is provided for removing residues such as latex components and rubber components remaining on the front surface 70a of the flexographic printing plate precursor 70 after development using a washing solution or the like. In the rinsing unit 14, removing residues such as latex components and rubber components remaining on the front surface 70a of the flexographic printing plate precursor 70 using a washing solution or the like is called a rinsing step.

The rinsing unit 14 has a pair of conveying rollers 36 on a downstream side of the pair of second conveying rollers 32 in the conveying direction D and in a rinsing tank 15, and a pair of conveying rollers 38 that conveys the flexographic printing plate precursor 70 to the outlet 11b of the housing 11. The developed flexographic printing plate precursor 70 is conveyed to the pair of conveying rollers 36 from the developing unit 12 and conveyed to the outside of the housing 11 by the pair of conveying rollers 38.

The developing tank 13 and the rinsing tank 15 are provided adjacent to each other, and in the rinsing tank 15, a side wall 15b is formed to be higher than the liquid level of the washing solution Q in the developing tank 13 so that the washing solution Q in the developing tank 13 is prevented from entering the rinsing tank 15.

For example, the rinsing unit 14 has a supply unit 22 that supplies the development fatigue liquid Qw processed by the processing unit 18 to the front surface 70a of the flexographic printing plate precursor 70. The development fatigue liquid Qw processed by the processing unit 18 is supplied to the supply unit 22 through a pipe 20.

In the rinsing unit 14, for example, between the pair of conveying rollers 36 and the pair of conveying rollers 38, the development fatigue liquid Qw processed by the processing unit 18 is applied to the front surface 70a of the flexographic printing plate precursor 70 after development as a washing solution Q from the supply unit 22 to be sprayed onto the front surface 70a of the flexographic printing plate precursor 70, for example, and thus the above residues are washed. The development fatigue liquid Qw from the supply unit 22 and the above washed residues are accumulated in rinsing tank 15.

The washing solution Q to be supplied may be a washing solution Q newly produced in another tank (not shown). The development fatigue liquid Qw accumulated in the rinsing tank 15 can be reused as a washing solution Q by being transferred to the developing tank 13. For the liquid transfer method, for example, a pump can be used. Moreover, a configuration in which the accumulated development fatigue liquid Qw is naturally supplied to the developing tank 13 across the side wall 15b may be adopted.

The pair of conveying rollers 36 described above has a roller 36a arranged on the back surface 70b side of the flexographic printing plate precursor 70 and a roller 36b arranged on the front surface 70a side of the flexographic printing plate precursor 70, and convey the flexographic printing plate precursor 70 with the flexographic printing plate precursor interposed therebetween.

The pair of conveying rollers 38 has a roller 38a arranged on the back surface 70b side of the flexographic printing plate precursor 70 and a roller 38b arranged on the front surface 70a side of the flexographic printing plate precursor 70, and convey the flexographic printing plate precursor 70 with the flexographic printing plate precursor interposed therebetween.

For example, both the roller 36a and the roller 36b described above are driven rollers. For example, one of the rollers 38a and 38b is a driving roller, and the other is a driven roller.

The processing unit 18 removes solids 23 in the development fatigue liquid Qw including the solids 23 generated by removing the unexposed portion by the development using the washing solution Q. In addition, the development fatigue liquid Qw containing the solids 23 means a state in which the solids 23 are dissolved or dispersed.

In addition, the processed development fatigue liquid Qw means that the solids 23 included in the development fatigue liquid Qw are removed.

In the processing unit 18, the solids 23 removed from the development fatigue liquid Qw are collected by a tray 19 provided below the processing unit 18.

On the other hand, the development fatigue liquid Qw from which the solids 23 are removed, that is, the above processed development fatigue liquid Qw is supplied to the supply unit 22 through the pipe 20 and used in the rinsing unit 14. For example, a pump (not shown) is used to supply the development fatigue liquid Qw processed from the processing unit 18 to the supply unit 22.

Since the development fatigue liquid Qw can be reused by providing the processing unit 18, the washing solution Q can be used effectively and the utilization efficiency of the washing solution Q can be increased.

As long as the processing unit 18 can remove the solids 23 from the development fatigue liquid Qw as described above, the configuration thereof is not particularly limited and is formed of, for example, a centrifuge.

In addition, a separation membrane 24 which removes the solids 23 in the development fatigue liquid Qw may be provided in the pipe 20. The separation membrane 24 is not particularly limited as long as the membrane can separate the solids included in the development fatigue liquid Qw, and is appropriately determined depending on the size of the solid matter to be separated, and for example, a ceramic filter is used. For example, the separation membrane 24 is preferably capable of separating a solid having a particle size of 1 µm or less.

The separation membrane 24 is not necessarily required and may be omitted. However, a case where the development fatigue liquid Qw is allowed to pass through the separation membrane 24 is preferable since the concentration of the solids of the development fatigue liquid Qw supplied to the rinsing unit 14 can be further reduced and a development fatigue liquid Qw having a low solid concentration can be used in the rinsing unit 14.

In addition, the separation membrane 24 may be used as the processing unit 18. In this case, for example, only the separation membrane 24 is provided without providing the above-described centrifuge.

The processing unit 18 is not necessarily required and a configuration without the processing unit 18 may be used. In this case, for example, the washing solution Q is used in the rinsing unit 14.

Here, as the concentration of the solids of the development fatigue liquid Qw increases, more development scum is fixed and the device is more easily contaminated. Accordingly, as the concentration of the solids of the development fatigue liquid Qw decreases, the contamination of the device can be more suppressed, and thus the maintainability is excellent. Therefore, it is preferable to provide the processing unit 18 that removes the solids.

Next, a method of developing the flexographic printing plate precursor 70 using the conveying type washing device 10 will be described.

First, an exposure device (not shown) exposes the front surface 70a of the flexographic printing plate precursor 70 with imagewise exposure, that is, a specific pattern.

Next, the flexographic printing plate precursor 70 after imagewise exposure is conveyed to the conveying type washing device 10. In the conveying type washing device 10, the flexographic printing plate precursor 70 is allowed to pass through the inlet 11a of the housing 11 and is conveyed into the washing solution Q by the plurality of guide rollers 34a, 34b, 34c, 34d, 34e, and 34d of the developing tank 13 through the pair of first conveying rollers 30. At this time, in a state in which the flexographic printing plate precursor 70 is immersed in the washing solution Q and conveyed, the unexposed portion of the flexographic printing plate precursor 70 is removed by the brushes 41 of the development unit 40 and developed. During this development, the development fatigue liquid Qw is generated. Then, the flexographic printing plate precursor is conveyed to the pair of conveying rollers 36 and the pair of conveying rollers 38 of the rinsing tank 15 through the pair of second conveying rollers 32. In a state in which the flexographic printing plate precursor 70 is conveyed, the development fatigue liquid Qw processed by the processing unit 18 is applied to the front surface 70a of the flexographic printing plate precursor 70 by the supply unit 22, and the residues on the front surface 70a are removed. Then, the flexographic printing plate precursor is conveyed from the pair of conveying rollers 38 to the outside through the outlet 11b of the housing 11.

As in the conveying type washing device 10, by performing the development step in a state in which the flexographic printing plate precursor 70 is being conveyed, the development processing amount per unit time can be increased as compared to batch processing, and thus high productivity is obtained. In addition, by curving and conveying the flexographic printing plate precursor 70, even in a case where the conveying path Dp is longer, the size of the actual developing unit 12 is not increased and space saving can be achieved. Further, by developing the flexographic printing plate precursor 70 in the washing solution Q, development scum is prevented from being fixed to the brushes 41, and the frequency of maintenance can be reduced. Thus, the maintenance load can be reduced and maintainability is excellent. In this manner, it is possible to achieve both maintainability and productivity.

Since the frequency of maintenance can be reduced, for example, the monthly or yearly average development processing can be increased, and the conveying type washing device 10 has high productivity in this viewpoint.

The configurations of the conveying unit 16 and the development unit 40 are not limited to those described above, and may be other configurations.

Figure 2:
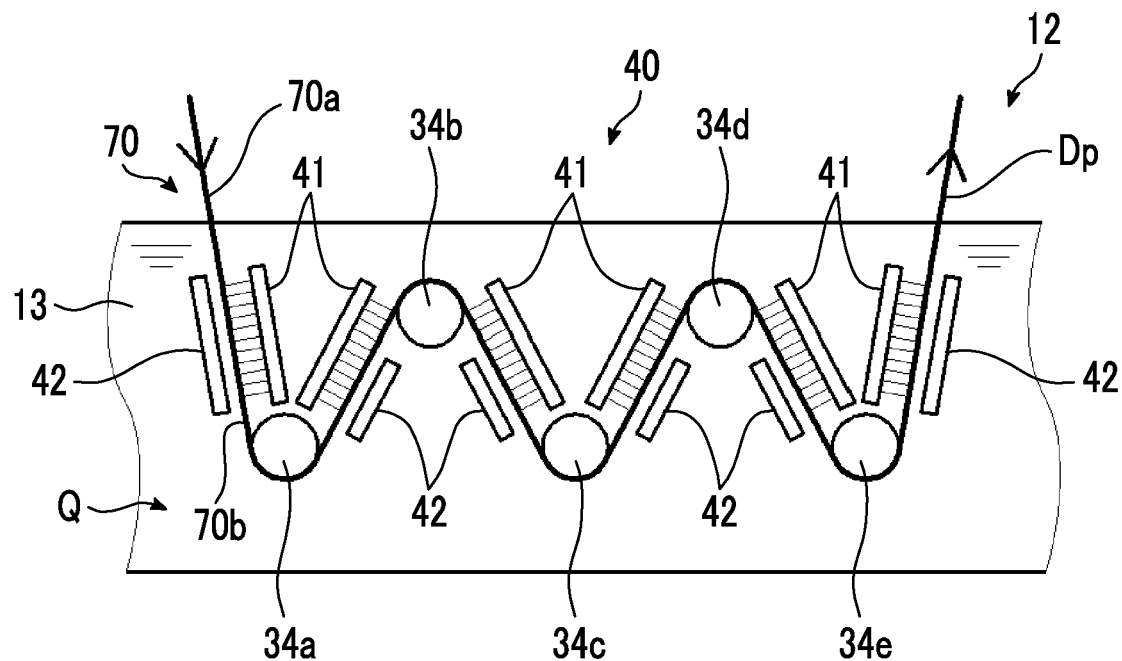
FIG. 2 is a schematic view showing another example of a developing unit of the first example of the conveying type washing device according to the embodiment of the present invention.
Figure 3:
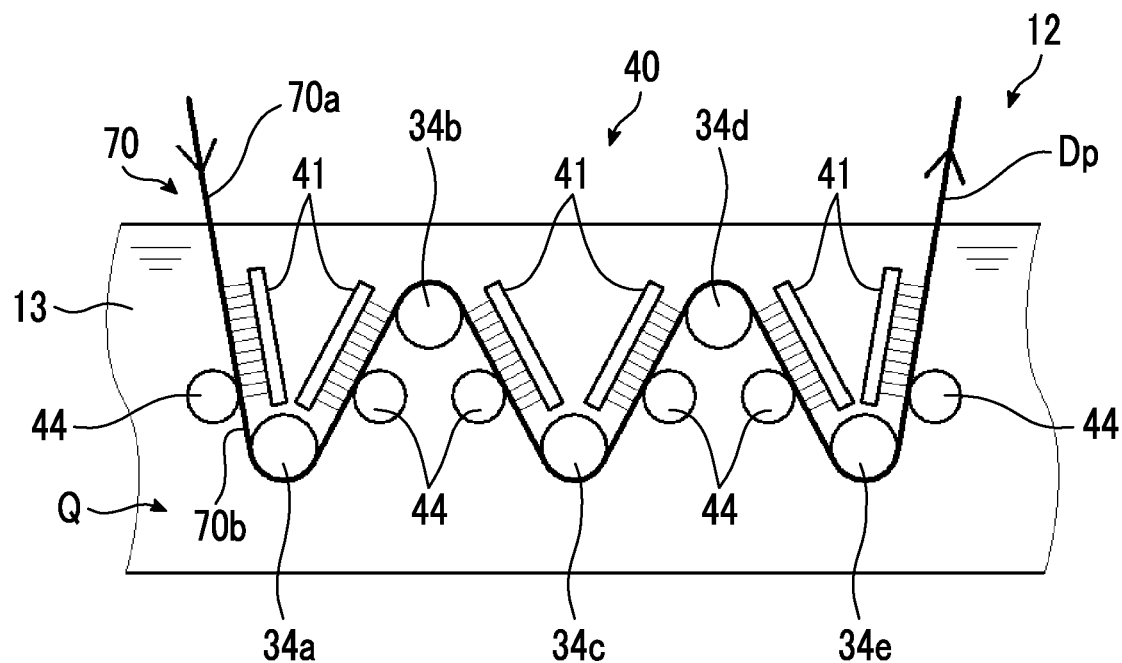
FIG. 3 is a schematic view showing still another example of the developing unit of the first example of the conveying type washing device according to the embodiment of the present invention.
Figure 4:
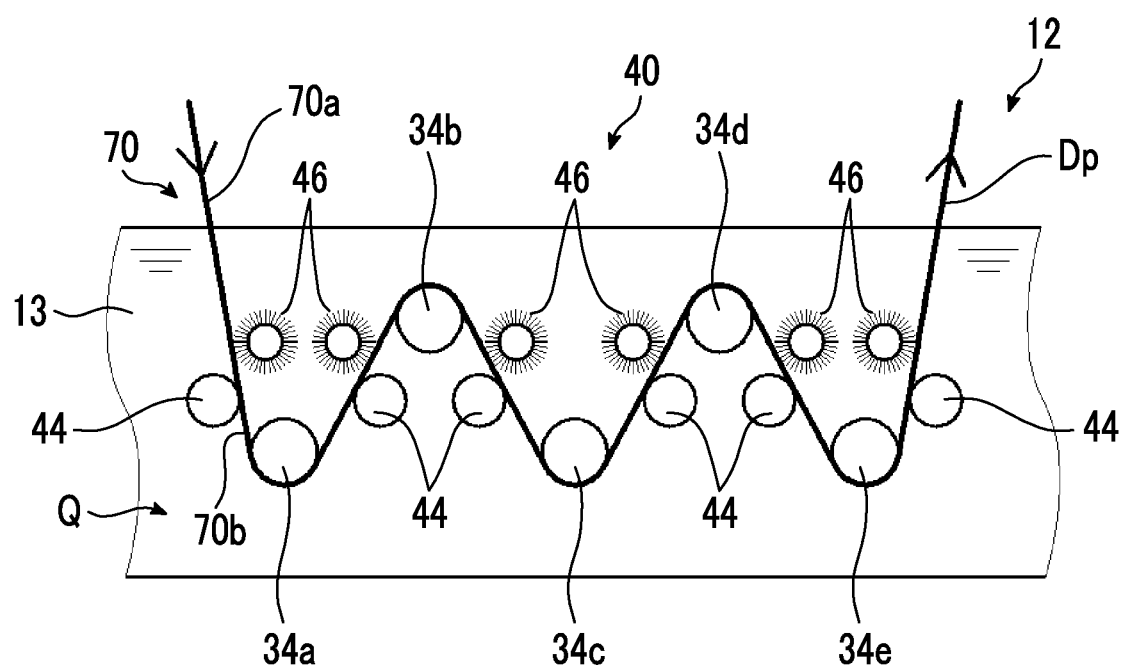
FIG. 4 is a schematic view showing still another example of the developing unit of the first example of the conveying type washing device according to the embodiment of the present invention.

Here, FIGS. 2 to 4 are schematic views showing other examples of the developing unit of the first example of the conveying type washing device according to the embodiment of the present invention. In FIGS. 2 to 4, the same components as those of the conveying type washing device 10 shown in FIG. 1 are denoted by the same reference numerals, and detailed description thereof is omitted.

In the configurations of the conveying unit 16 and the development unit 40 of the conveying type washing device 10, for example, as shown in FIG. 2, a configuration in which supports 42 that support the flexographic printing plate precursor 70 are provided at positions opposite to the brushes 41 with the flexographic printing plate precursor 70 interposed therebetween may be adopted. Since the flexographic printing plate precursor 70 has flexibility as described above, there is a possibility that the unexposed portion may not be efficiently removed by the brushes 41 due to, for example, bending in a case where the flexographic printing plate precursor is rubbed against the brushes 41. However, by providing the supports 42, the back surface 70b of the flexographic printing plate precursor 70 is supported by the supports 42 in a case where the unexposed portion is removed by the brushes 41 and thus the unexposed portion can be efficiently removed. In addition, the support 42 functions as a conveying guide for the flexographic printing plate precursor 70, and the flexographic printing plate precursor 70 can be conveyed more stably.

The support 42 preferably has strength not to be deformed by brush pressure, heat resistance, and rust resistance that does, and the material of the support 42 is preferably, for example, stainless steel or plastic.

In addition, instead of the support 42 shown in FIG. 2, as shown in FIG. 3, a guide roller 44 may be provided in contact with the back surface 70b of the flexographic printing plate precursor 70. In this case, similar to the support 42 shown in FIG. 2, since the back surface 70b of the flexographic printing plate precursor 70 is supported by the guide roller 44 in a case where the unexposed portion is removed by the brushes 41, the unexposed portion can be efficiently removed. In addition, the guide roller 44 functions as a conveying guide for the flexographic printing plate precursor 70, and the flexographic printing plate precursor 70 can be conveyed more stably.

The development unit 40 is not limited to the brush 41 described above, and a rotatable roller-shaped brush 46 shown in FIG. 4 may be used instead of the brush 41. The guide rollers 44 in contact with the back surface 70b of the flexographic printing plate precursor 70 are provided at positions opposite to roller-shaped brushes 46 with the flexographic printing plate precursor 70 interposed therebetween. In the development unit 40, the unexposed portion is removed while being interposed between the roller-shaped brushes 46 and the guide rollers 44. Also, in this case, similarly to the support 42 shown in FIG. 2, the unexposed portion can be efficiently removed. Further, by sandwiching the flexographic printing plate precursor 70 between the roller-shaped brushes 46 and the guide rollers 44, the flexographic printing plate precursor 70 can be conveyed more stably.

The roller-shaped brush 46 is obtained by bundling bristles radially with respect to an axis. As the bristles of the brush 46, the same bristles as the bristles of the brush 41 described above can be used.

In the configuration shown in FIG. 4, instead of the guide roller 44, the support 42 shown in FIG. 2 can be provided.

Next, a second example of the conveying type washing device will be described.

Figure 5:
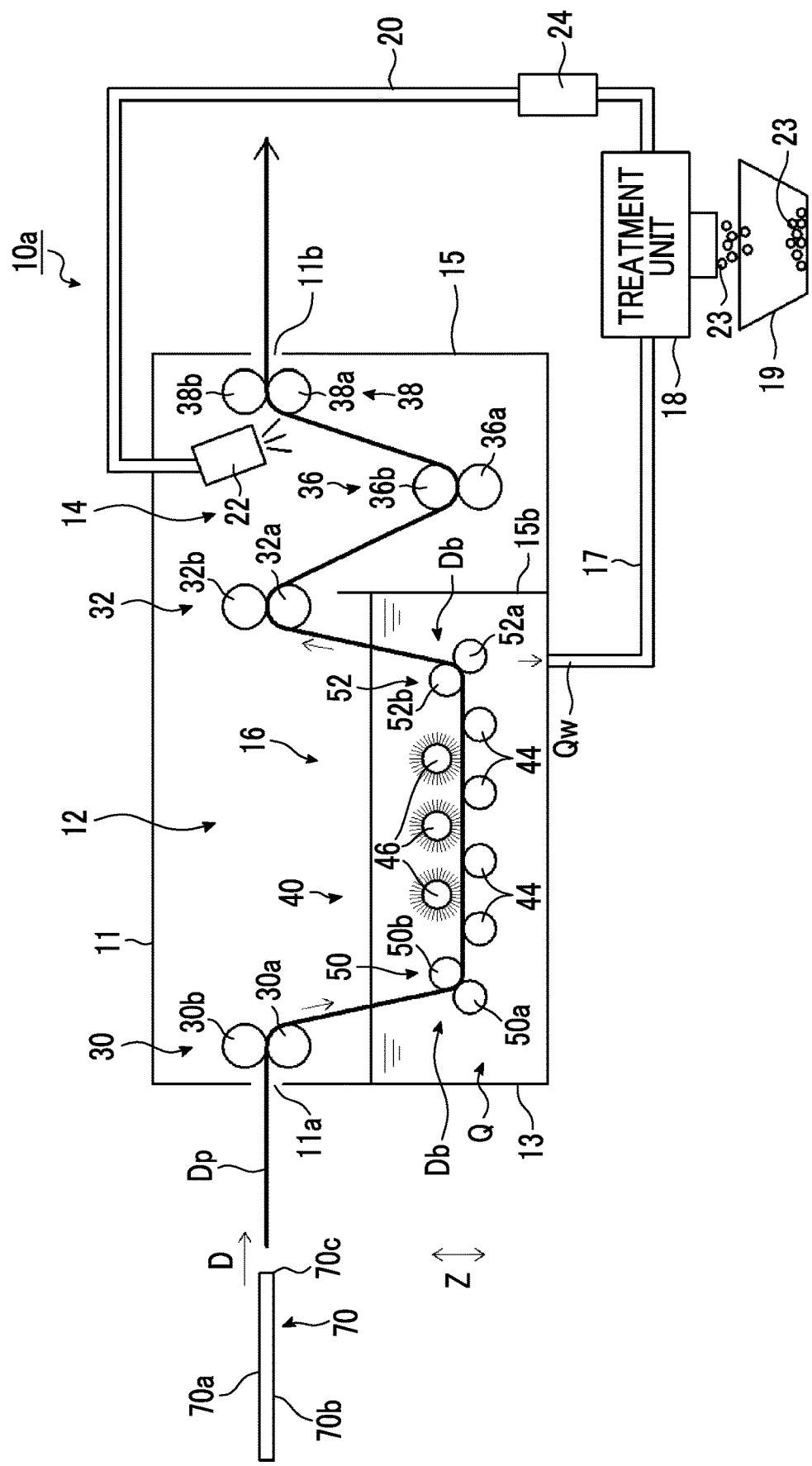
FIG. 5 is a schematic view showing a second example of the conveying type washing device according to the embodiment of the present invention.

FIG. 5 is a schematic view showing a second example of the conveying type washing device according to the embodiment of the present invention. In FIG. 5, the same components as those of the conveying type washing device 10 shown in FIG. 1 are denoted by the same reference numerals, and detailed description thereof is omitted.

A conveying type washing device 10a shown in FIG. 5 is different from the conveying type washing device 10 shown in FIG. 1 in that the conveying path Dp of the flexographic printing plate precursor 70, the configuration of the conveying unit 16, and the configuration of the development unit 40 are different, and the configurations other than the above configurations are the same as those of the conveying type washing device 10 shown in FIG. 1. Thus, detailed description thereof is omitted.

The conveying unit 16 has a pair of conveying rollers 50 and a pair of conveying rollers 52 arranged apart from each other in the developing tank 13 instead of the guide rollers 34a, 34b, 34c, 34d, and 34e (refer to FIG. 1). The flexographic printing plate precursor 70 is conveyed substantially horizontally in the developing tank 13. In the developing tank 13, the conveying path Dp is linear.

In the development unit 40, for example, three roller-shaped brushes 46 that are in contact with the front surface 70a of the flexographic printing plate precursor 70 are arranged apart from each other. In addition, the plurality of guide rollers 44 are arranged opposite to the roller-shaped brushes 46 with the flexographic printing plate precursor 70 interposed therebetween. In a case where the flexographic printing plate precursor 70 is conveyed, the unexposed portion is removed by the brushes 46.

The conveying type washing device 10a can develop the flexographic printing plate precursor 70 in the same manner as the conveying type washing device 10 shown in FIG. 1.

In addition, in the conveying type washing device 10a, as in the conveying type washing device 10 shown in FIG. 1, the conveying path Dp includes the curved conveying path Db, and in a state in which the flexographic printing plate precursor 70 is immersed in the washing solution Q and conveyed, development is performed. Therefore, the effects similar to the conveying type washing device 10 shown in FIG. 1 can be acquired.

Even in the conveying type washing device 10a, since the flexographic printing plate precursor 70 is conveyed while being interposed between the brushes 46 and the guide rollers 44, the unexposed portion can be efficiently removed and the flexographic printing plate precursor 70 can be more stably conveyed.

The number of brushes 46 and the number of guide rollers 44 are appropriately determined depending on the size of the developing tank 13, the size of the flexographic printing plate precursor 70, and the like.

In the conveying type washing device 10a shown in FIG. 5, the configurations of the conveying unit 16 and the development unit 40 are not limited to those described above, and other configurations may be adopted.

Figure 6:
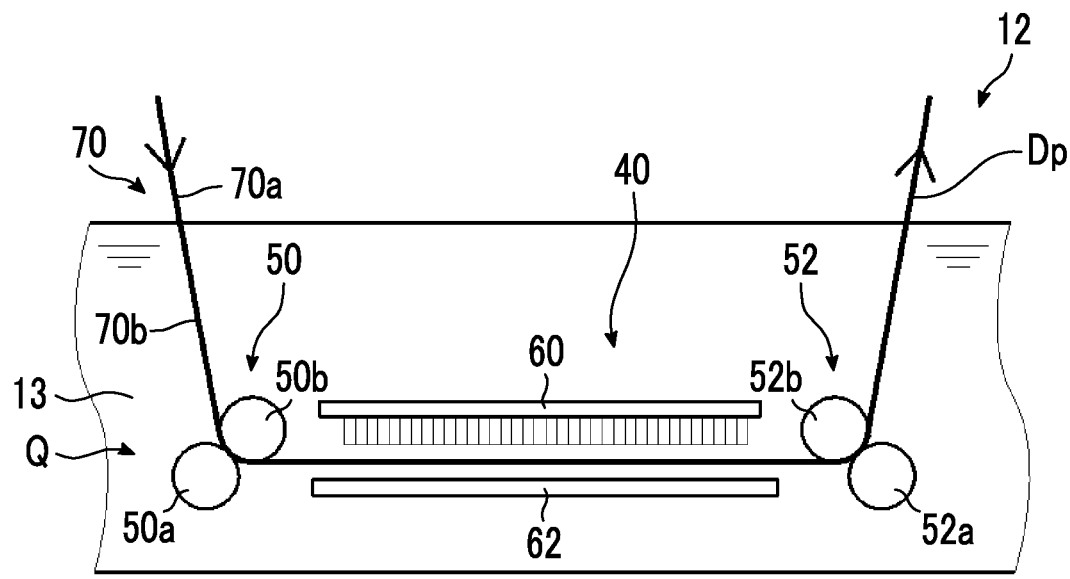
FIG. 6 is a schematic view showing another example of a developing unit of the second example of the conveying type washing device according to the embodiment of the present invention.
Figure 7:
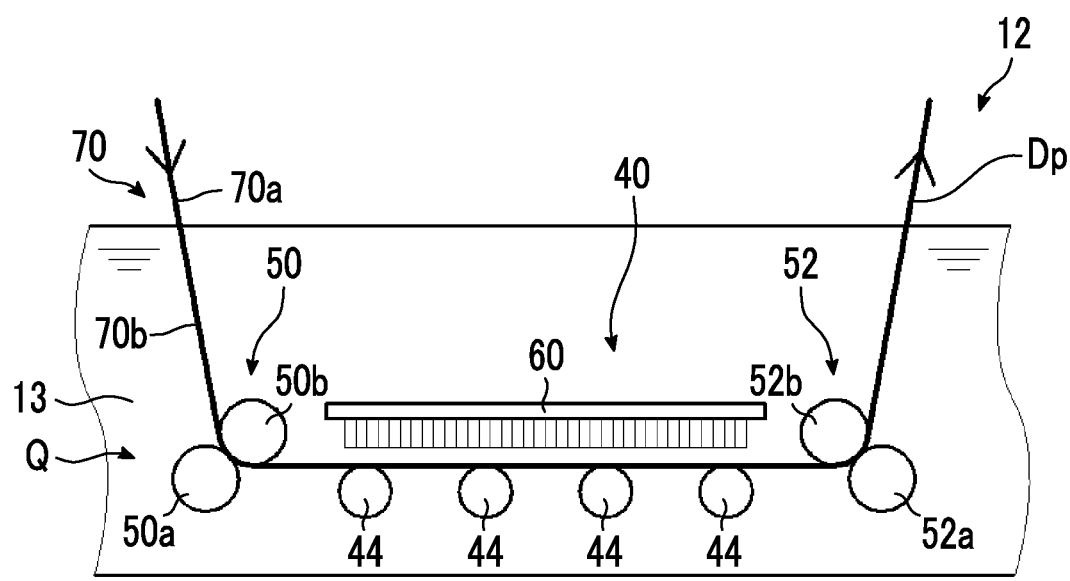
FIG. 7 is a schematic view showing still another example of the developing unit of the second example of the conveying type washing device according to the embodiment of the present invention.

Here, FIGS. 6 and 7 are schematic views showing other examples of the developing unit of the second example of the conveying type washing device according to the embodiment of the present invention. In FIGS. 6 and 7, the same components as those of the conveying type washing device 10a shown in FIG. 5 are denoted by the same reference numerals, and detailed description thereof is omitted.

As shown in FIG. 6, the development unit 40 may include a brush 60 arranged on the front surface 70a side of the flexographic printing plate precursor 70 and a support 62 arranged oppositely with the flexographic printing plate precursor 70 interposed therebetween.

Further, as shown in FIG. 7, instead of the support 62 in FIG. 6, the plurality of guide rollers 44 may be arranged.

The brush 60 is obtained by bundling bristles perpendicular to a substrate. As the bristles of the brush 60, the same bristles as the bristles of the brush 41 described above can be used. In addition, one brush 60 may be used and a plurality of the brushes 60 may be arranged by adjusting the size of the brush. One support 62 may be used and a plurality of the support 62 may be arranged by adjusting the size of the support. As the support 62, the same support as the support 42 shown in FIG. 2 described above can be used.

In the conveying type washing device 10a shown in FIG. 5, for example, the support 62 shown in FIG. 6 described above may be arranged instead of the guide roller 44. Even in this case, one support 62 may be used and a plurality of the supports 62 may be arranged by adjusting the size of the support.

The above-described conveying unit 16 has been described by taking the roller conveying system as an example, but is not limited thereto. The conveying unit 16 can adopt, for example, least one of a belt conveying system, the above-described roller conveying system, a gear conveying system, or a guide conveying system.

In the case of the belt conveying system, for example, in the conveying type washing device 10a shown in FIG. 5, an endless belt (not shown) is arranged instead of the guide roller 44, and this endless belt is driven by a drive unit (not shown) to convey the flexographic printing plate precursor 70.

In the case of the gear conveying system, for example, a jig (not shown) having gears at both ends for conveying the flexographic printing plate precursor 70 (not shown) is attached to an end portion 70c (refer to FIGS. 1 and 5) of the flexographic printing plate precursor 70. The flexographic printing plate precursor 70 is conveyed by engaging the gear of the jig with the driving gear and rotating the driving gear. A ball spline gear can also be used in the gear conveying system.

In the case of the guide conveying system, for example, a strip member (not shown) for conveying the flexographic printing plate precursor 70 (not shown) is attached to the end portion 70c (refer to FIGS. 1 and 5) of the flexographic printing plate precursor 70, and the strip member is allowed to pass through, for example, the outlet 11b of the housing 11 and is wound outside the outlet 11b to convey the flexographic printing plate precursor 70.

The flexographic printing plate precursor 70 forms a flexographic printing plate used for flexographic printing, and the configuration thereof is not particularly limited. The flexographic printing plate precursor 70 is as thin as about several millimeters and has flexibility. In addition, having flexibility means returning to the original state after unloading the force from the bent state due to the action of the force. The size of the flexographic printing plate precursor 70 is, for example, 900 mm×1200 mm.

The flexographic printing plate precursor 70 is preferably a precursor that can be developed by an aqueous developer having water as a main component, or a water developing type flexographic printing plate precursor. In this case, the washing solution is an aqueous developer.

As the flexographic printing plate precursor 70, a known flexographic printing plate precursor that can be developed by an aqueous developer can be used. As the flexographic printing plate precursor 70, a flexographic plate material compatible with a computer to plate (CTP) having a black layer applied to the surface thereof may be used.

Hereinafter, the washing solution will be described.
<Washing Solution>
The washing solution is preferably an aqueous washing solution, and may be a liquid constituted solely of water, or an aqueous solution containing 50% by mass or more of water and a water-soluble compound added thereto. Examples of water-soluble compounds include surfactants, acids, and alkalis. The above aqueous washing solution corresponds to an aqueous developer.

Examples of the surfactant include an anionic surfactant, a nonionic surfactant, a cationic surfactant, and an amphoteric surfactant, and among these, an anionic surfactant is preferable.

Specific examples of the anionic surfactant include aliphatic carboxylates such as sodium laurate and sodium oleate; higher alcohol sulfate ester salts such as sodium lauryl sulfate, sodium cetyl sulfate, and sodium oleyl sulfate; polyoxyethylene alkyl ether sulfate ester salts such as sodium polyoxyethylene lauryl ether sulfate; polyoxyethylene alkylaryl ether sulfate ester salts such sodium polyoxyethylene octylphenyl ether sulfate, and sodium polyoxyethylene nonylphenyl ether sulfate; alkyl sulfate salts such as alkyldiphenyl ether disulfonate salt, sodium dodecyl sulfonate, and sodium dialkyl sulfosuccinate; alkylaryl sulfonate salts such as alkyl disulfonate salt, sodium dodecylbenzene sulfonate, sodium dibutylnaphthalene sulfonate, and sodium triisopropylnaphthalene sulfonate; higher alcohol phosphate ester salts such as disodium lauryl phosphate and sodium dilauryl phosphate; and polyoxyethylene alkyl ether phosphate ester salts such as disodium polyoxyethylene lauryl ether phosphate, and sodium polyoxyethylene dilaurylether phosphate. These may be used alone or in combination of two or more thereof. As specific examples, sodium salts are mentioned, but the surfactant is not particularly limited to the sodium salts. The same effects can be obtained using calcium salts or ammonia salts.

Specific examples of the nonionic surfactant include alkaline salt compounds such as polyoxyethylene alkyl ethers such as polyoxyethylene oleyl ether and polyoxyethylene lauryl ether, polyoxyethylene polyoxypropylene glycols such as polyoxyethylene alkylphenyl ethers such as polyoxyethylene nonyl phenyl ether and polyoxyethylene octyl phenyl ether, mono- and diesters of fatty acids with polyethylene glycol such as polyethylene glycol monostearate, polyethylene glycol monooleate, and polyethylene glycol dilaurate, esters of fatty acids with sorbitan such as sorbitan monolaurate and sorbitan monooleate, esters of polyoxyethylene adducts of sorbitan with fatty acids such as polyoxyethylene sorbitan monolaurate, polyoxyethylene sorbitan monostearate, and polyoxyethylene sorbitan trilaurate, esters of fatty acids and sorbitol such as sorbitol monopalmitate and sorbitol dilaurate, esters of polyoxyethylene adducts of sorbitol and fatty acids such as polyoxyethylene sorbitol monostearate and polyoxyethylene sorbitol dioleate, esters of fatty acids with pentaerythriol such as pentaerythritol monostearate, esters of fatty acid with glycerin such as glycerin monolaurate, fatty acid alkanolamides such as lauric acid diethanolamide and lauric acid monoethanolamide, amine oxides such as lauryldimethylamine oxide, fatty acid alkanolamines such as stearyldiethanolamin, polyoxyethylene alkylamines, triethanolamine fatty acid esters, phosphates, carbonates, and silicates. These may be used alone or in combination of two or more thereof.

Specific examples of the cationic surfactant include primary, secondary, and tertiary amine salts such as monostearylammonium chloride, distearyl ammonium chloride, and tristearylammonium chloride, quaternary ammonium salts such as stearyltrimethylammonium chloride, distearyldimethyl ammonium chloride, and stearyldimethylbenzylammonium chloride, alkyl-pyridinium salts such as N-cetylpyridinium chloride and N-stearylpyridinium chloride, N,N-dialkylmorpholinium salts, fatty acid amide salts of polethylenepolyamine, acetic acid salts of urea compounds of amides of aminoethylethanolamine and stearic acid, and 2-alkyl-1-hydroxy-ethylimidazolinium chloride. These may be used alone or in combination of two or more thereof.

Specific examples of the amphoteric surfactant include amino acid type amphoteric surfactants such as sodium laurylaminepropionate, carboxy betaine type amphoteric surfactants such as lauryldimethylbetaine and lauryldihydroxyethylbetaine, sulfobetaine type amphoteric surfactants such as stearyldimethylsulfoethyleneammonium ethyleneammonium betaine, imidazoliniumbetaine type amphoteric surfactants, and lecithin. These may be used alone or in combination of two or more thereof.

Specific examples of acids include inorganic and organic acids such as hydrochloric acid, sulfuric acid, nitric acid, phosphoric acid, formic acid, acetic acid, oxalic acid, succinic acid, citric acid, malic acid, maleic acid, and paratoluensulfonic acid.

Specific examples of alkalis include lithium hydroxide, sodium hydroxide, magnesium hydroxide, potassium hydroxide, calcium hydroxide, calcium oxide, sodium carbonate, sodium hydrogen carbonate, and calcium carbonate.

Hereinafter, the development fatigue liquid will be described in detail.

<Development Fatigue Liquid>

The development fatigue liquid is not particularly limited as long as the liquid is a washing solution including solids generated by removing the unexposed portion of the flexographic printing plate precursor by the development using the above washing solution, that is, a washing solution including an uncured resin. However, a development fatigue liquid containing a conventionally known photosensitive resin composition for forming a general photosensitive resin layer may also be included.

The uncured resin removed by development may be a photosensitive resin included in the photosensitive resin composition.

In addition, since it is preferable that the development fatigue liquid in a case of performing development by a laser ablation masking (LAM) method is an object to be processed, the uncured resin removed by development is preferably a photosensitive resin included in a photosensitive resin composition.

As such a photosensitive resin composition includes, for example, a composition containing a polymerization initiator, a polymerizable compound, a polymerization inhibitor, a plasticizer, and the like in addition to the photosensitive resin may be used. Thus, the development fatigue liquid may contain a polymerization initiator, a polymerizable compound, a polymerization inhibitor, a plasticizer, and the like in addition to the uncured resin.

<Uncured Resin>

The uncured resin included in the development fatigue liquid refers to a solid generated by removing the unexposed portion. Examples of the uncured resin included in the development fatigue liquid include a water dispersible latex, a rubber component, a polymer component, and a noncrosslinked ethylenically unsaturated compound (polymer).

Examples of the water dispersible latex include water dispersible latex polymers of water dispersible latexes such as a polybutadiene latex, a natural rubber latex, a styrene-butadiene copolymer latex, an acrylonitrile-butadiene copolymer latex, a polychloroprene latex, a polyisoprene latex, a polyurethane latex, a methyl methacrylate-butadiene copolymer latex, a vinylpyridine copolymer latex, a butyl polymer latex, a thiokol polymer latex, and an acrylate polymer latex, and a polymer obtained by copolymerization of one of the above-described polymers and another component such as acrylic acid and methacrylic acid.

Examples of the rubber component include butadiene rubber, isoprene rubber, styrene-butadiene rubber, acrylonitrile rubber, acrylonitrile butadiene rubber, chloroprene rubber, polyurethane rubber, silicon rubber, butyl rubber, ethylene-propylene rubber, and epichlorohydrin rubber.

The polymer component may be hydrophilic or hydrophobic, and specific examples thereof include a polyamide resin, an unsaturated polyester resin, an acrylic resin, a polyurethane resin, a polyester resin, and a polyvinyl alcohol resin.

The solid having a specific gravity lower than that of the washing solution is, for example, a photosensitive resin such as a rubber component or latex.

The solid having a higher specific gravity than the washing solution is a component of an overcoat layer such as carbon.

Examples of the ethylenically unsaturated compound (polymer) include a (meth)acryl-modified polymer having an ethylenically unsaturated bond in the molecule.

Examples of the (meth)acryl-modified polymer include (meth)acryl-modified butadiene rubber and (meth)acryl-modified nitrile rubber.

The expression "(meth)acryl" is a notation representing acryl or methacryl, and the expression "(meth)acrylate" described later is a notation representing acrylate or methacrylate.

The uncured resin included in the development fatigue liquid is not particularly limited and the amount thereof is preferably 70% by mass or less and more preferably 35% by mass or less.

<Polymerization Initiator>

The polymerization initiator that may be included in the development fatigue liquid is preferably a photopolymerization initiator.

Examples of the photopolymerization initiator include alkylphenones, acetophenones, benzoin ethers, benzophenones, thioxanthones, anthraquinones, benzils, and biacetyls. Among these, alkylphenones are preferable.

Specific examples of photopolymerization initiators of alkylphenones include 2,2-dimethoxy-1,2-diphenylethane-1-one, 1-hydroxy-cyclohexyl-phenyl-ketone, and 2-hydroxy-2-methyl-1-phenyl-propan-1-one.

The concentration of the polymerization initiator that may be included in the development fatigue liquid is not particularly limited and is preferably 2.0% by mass or less and more preferably 1.0% by mass or less.

<Polymerizable Compound>

Examples of the polymerizable compound that may be included in the development fatigue liquid include ethylenically unsaturated compounds corresponding to so-called monomer components other than the above-described ethylenically unsaturated compounds (polymers).

The ethylenically unsaturated compound may be a compound having one ethylenically unsaturated bond or a compound having two or more ethylenically unsaturated bonds.

Specific examples of the compound having one ethylenically unsaturated bond include a (meth)acrylate having a hydroxyl group such as 2-hydroxyethyl(meth)acrylate, 2-hydroxypropyl(meth)acrylate, 2-hydroxybutyl(meth)acrylate, 3-chloro-2-hydroxypropyl (meth)acrylate, and β-hydroxy-β'-(meth)acryloyloxyethyl phthalate; an alkyl(meth)acrylate such as methy(meth)acrylate, ethyl(meth)acrylate, propyl(meth)acrylate, butyl(meth)acrylate, isoamyl(meth)acrylate, 2-ethylhexyl(meth)acrylate, lauryl(meth)acrylate, and stearyl(meth)acrylate; a cycloalkyl(meth)acrylate such as cyclohexyl(meth)acrylate; halogenated alkyl(meth)acrylates such as chloroethyl(meth)acrylate, and chloropropyl (meth)acrylate; an alkoxyalkyl(meth)acrylate such as methoxyethyl(meth)acrylate, ethoxyethyl(meth)acrylate, and butoxyethyl(meth)acrylate; a phenoxyalkyl(meth)acrylate such as phenoxyethyl acrylate, and nonylphenoxyethyl (meth)acrylate; an alkoxyalkylene glycol(meth)acrylate such as ethoxydiethylene glycol(meth)acrylate, methoxytriethylene glycol(meth)acrylate, and methoxydipropylene glycol(meth)acrylate; 2,2-dimethylaminoethyl(meth)acrylate, 2,2-diethylaminoethyl(meth)acrylate, 2-hydroxyethyl (meth)acrylate, and 3-chloro-2-hydroxypropyl(meth)acrylate.

Specific examples of the ethylenically unsaturated compound containing two or more ethylenically unsaturated bonds include an alkyldioldi(meth)acrylate such as 1,9-nonanedioldi(meth)acrylate; a polyethylene glycoldi(meth)acrylate such as diethyleneglycoldi(meth)acrylate; a polypropylene glycoldi(meth)acrylate such as dipropyleneglycoldi(meth)acrylate; trimethylolpropane tri(meth)acrylate, pentaerythritol tri(meth)acrylate, pentaerythritol tetra(meth)acrylate, glycerol tri(meth)acrylate, a polyvalent (meth)acrylate obtained by an addition reaction of a compound having an ethylenically unsaturated bond such as an unsaturated carboxylic acid or an unsaturated alcohol and an activated hydrogen to ethylene glycol diglycidyl ether; a polyvalent(meth)acrylate obtained by an addition reaction of a compound having an active hydrogen such as a carboxylic acid and an amine to an unsaturated epoxy compound such as glycidyl(meth)acrylate; a polyvalent (meth)acrylamide such as methylene-bis-(meth)acrylamide; and a polyvalent vinyl compound such as divinylbenzene.

The concentration of the polymerizable compound that may be included in the development fatigue liquid is not particularly limited and is preferably 30.0% by mass or less and more preferably 15.0% by mass or less.

<Polymerization Inhibitor>

Specific examples of the polymerization inhibitor that may be included in the development fatigue liquid include hydroquinone monomethyl ether, p-methoxyphenol, di-t-butyl-p-cresol, pyrogallol, t-butylcatechol, benzoquinone, 4,4'-thiobis(3-methyl-6-t-butylphenol), 2,2'-methylenebis (4-methyl-6-t-butylphenol), and N-nitrosophenylhydroxylamine primary cerium salt.

The concentration of the polymerization inhibitor that may be included in the development fatigue liquid is not particularly limited and is preferably 0.3% by mass or less and more preferably 0.15% by mass or less.

<Plasticizer>

Examples of the plasticizer that may be included in the development fatigue liquid include a liquid rubber, an oil, a polyester, and a phosphate compound.

Specific examples of the liquid rubber include a liquid polybutadiene, a liquid polyisoprene, and derivatives thereof modified by maleic acid or an epoxy group.

Specific examples of the oil include a paraffin, a naphthene, and an aromatic.

Specific examples of the polyester include an adipate polyester.

Specific examples of the phosphate compound include a phosphate ester.

The concentration of the plasticizer that may be included in the development fatigue liquid is not particularly limited and is preferably 30% by mass or less and more preferably 15% by mass or less.

The present invention is basically configured as described above. The conveying type washing device of the embodiment of the present invention has been described in detail above, but the present invention is not limited to the above-described embodiments. Various improvements or modifications may be of course made without departing from the scope of the present invention.

EXAMPLES

The present invention will be described more specifically with reference to the following examples. The materials, reagents, used amounts, substance amounts, ratios, processing details, processing procedures, and the like shown in the following examples can be appropriately changed without departing from the spirit of the present invention. Accordingly, the scope of the present invention should not be construed as being limited by the specific examples shown below.

In Examples, space saving, productivity, and maintainability were evaluated for the washing devices of Examples 1 and 2 and Comparative Examples 1 to 5.

Hereinafter, the space saving, productivity, and maintainability will be described.

The space saving was evaluated by the size of the development unit of each washing device. The smaller the development unit, the better the space saving.

For the productivity, the development area per hour ($m^2$/hr) was evaluated. The larger the development area per hour, the better the productivity.

For the maintainability, the frequency of device cleaning per month and the cleaning time per time were evaluated. The lower the frequency of device cleaning and the shorter the cleaning time, the better the maintainability.

The devices and chemicals used in Examples 1 and 2 and Comparative Examples 1 to 5 are shown below.

<Imaging Machine>

CDI Spark 4835 Inline (manufactured by Esko-Graphics BV.)

<Exposure Machine>

Ultraviolet exposure machine Concept 302 ECDLF (tradename) (manufactured by Glunz&Jensen)

<Flexographic Printing Plate Precursor>

FLENEX FW-L (manufactured by Fujifilm Global Graphic Systems Co., Ltd.)

<Washing Solution>

Aqueous solution of FINISH POWER & PURE POWDER SP (manufactured by Reckitt Benckiser Japan Ltd.) (concentration: 0.5% by mass)

<Imagewise Exposure of Flexographic Printing Plate Precursor>

The above flexographic printing plate precursor was back-exposed by exposing the flexographic printing plate precursor for 10 seconds with 80 W energy from the back surface of the flexographic printing plate precursor using the above-mentioned UV exposure machine. Then, a mask layer was imaged by ablation using the above imaging machine, and main exposure was performed from the front surface (the back surface of the back surface) at 80 W for 1000 seconds. The flexographic printing plate precursor subjected to main exposure was used as a flexographic printing plate precursor after imagewise exposure.

Next, Examples 1 and 2 and Comparative Examples 1 to 5 will be described.

Example 1

In Example 1, the flexographic printing plate precursor after imagewise exposure was developed using the conveying type washing device shown in FIG. 1. In Example 1, the brush was arranged in the washing solution. In Example 1, the processing unit was not used and the device was configured not to have the processing unit.

Example 2

Example 2 had the same configuration as Example 1 except that as compared to Example 1, a centrifuge (UB-S1 (manufactured by Ameloid Nippon Services Co., Ltd.)) was used in the processing unit.

Comparative Example 1

Comparative Example 1 had the same configuration as Example 1 except that as compared to Example 1, the brush was arranged outside the washing solution and the development of the flexographic printing plate precursor was performed outside the washing solution.

Comparative Example 2

Comparative Example 2 had the same configuration as Example 1 except that as compared to Example 1, the device configuration was different, the device was a horizontal conveying type in which the flexographic printing plate precursor was horizontally conveyed, the brush was arranged outside the washing solution, and the development of the flexographic printing plate precursor was performed outside the washing solution. Comparative Example 2 corresponds to JP5683029B.

Comparative Example 3

Comparative Example 3 had the same configuration as Comparative Example 2 except that as compared to Comparative Example 2, the size of the development unit was small.

Comparative Example 4

Comparative Example 4 had the same configuration as Example 1 except that as compared to Example 1, the device configuration was different, and a washing device called a clam shell type using a batch processing method was used. Comparative Example 4 corresponds to JP1996-304941A (JP-H09-304941A).

Comparative Example 5

Comparative Example 5 had the same configuration as Example 1 except that as compared to Example 1, the device configuration was different, a washing device called a clam shell type using a batch processing method was used, the brush was arranged outside the washing solution, and the development of the flexographic printing plate precursor was performed outside the washing solution.

TABLE 1

| | Washing device configuration | | | Space saving | | Maintainability | |
| | | | | | | Frequency of | |
| | Washing device type | Brush position | Processing unit | (Development unit size) ($m^2$) | Productivity ($m^2/hr$) | cleaning (times/month) | Cleaning time (hr/time) |
|---|---|---|---|---|---|---|---|
| Example 1 | Curved conveying type | In washing solution | Not provided | 1.4 | 3.8 | 10 | 4 |
| Example 2 | Curved conveying type | In washing solution | Provided | 1.4 | 3.8 | 1 | 2 |
| Comparative Example 1 | Curved conveying type | Outside washing solution | Not provided | 1.4 | 3.8 | 10 | 8 |
| Comparative Example 2 | Horizontal conveying type | Outside washing solution | Not provided | 2 | 2.5 | 10 | 8 |
| Comparative Example 3 | Horizontal conveying type | Outside washing solution | Not provided | 1 | 1.3 | 10 | 8 |
| Comparative Example 4 | Clam shell type | In washing solution | Not provided | 2 | 2.5 | 10 | 4 |
| Comparative Example 5 | Clam shell type | Outside washing solution | Not provided | 2 | 2.5 | 10 | 8 |

In Examples 1 and 2 and Comparative Examples 1 to 5, it was confirmed that the state of the flexographic printing plate precursor after development was almost the same.

However, as shown in Table 1, in Examples 1 and 2, as compared to Comparative Examples 1 to 5, it was possible to achieve both productivity and maintainability and realize space saving.

In addition, from Examples 1 and 2, it is preferable to provide the processing unit since the solid concentration of the development fatigue liquid can be reduced and the maintainability is excellent.

In Comparative Example 1, the device configuration was the same as in Examples 1 and 2, but the brush was provided outside the washing solution and the development was performed outside the washing solution. Thus, the maintainability was deteriorated.

In Comparative Examples 2 and 3, the device configuration was a horizontal conveying type, and thus it was not possible to achieve both space saving and productivity. In addition, since the development was performed outside the washing solution, the maintainability was deteriorated.

In Comparative Example 4, since the device configuration was a clam shell type, the space saving and the productivity were deteriorated.

In Comparative Example 5, since the device configuration was a clam shell type and the development was performed outside the washing solution, the space saving, the productivity, and the maintainability were deteriorated.

EXPLANATION OF REFERENCES 10, 10a: conveying type washing device
11: housing
11a: inlet
11b: outlet
12: developing unit
13: developing tank
14: rinsing unit
15: rinsing tank
15b: side wall
16: conveying unit
17: connection pipe
18: processing unit
19: tray
20: pipe
22: supply unit
23: solid
24: separation membrane
30: pair of first conveying rollers
30a, 30b: roller
32: pair of second conveying rollers
32a, 32b: roller
34a, 34b, 34c, 34d, 34e, and 44: guide roller
36, 38: pair of conveying rollers
36a, 36b, 38a, and 38b: roller
40: development unit
41, 46: brush
42: support
50, 52: pair of conveying rollers
60: brush
62: support
70: flexographic printing plate precursor
70a: front surface
70b: back surface
70c: end portion
D: conveying direction
Db: conveying path
Dp: conveying path
Q: washing solution
Qw: development fatigue liquid
Z: direction

What is claimed is:

1. A conveying type washing device that develops a flexographic printing plate precursor after imagewise exposure using a washing solution, the device comprising:
a conveying unit that conveys the flexographic printing plate precursor through a conveying path including a curved conveying path;
a development unit that develops the flexographic printing plate precursor in a state in which the flexographic printing plate precursor is immersed in the washing solution by the conveying unit and conveyed, wherein the development unit has a brush used for development, and the brush is movable in parallel relative to the flexographic printing plate precursor; and
a processing unit having a separation membrane that removes solids in a development fatigue liquid, the solids being generated by removing an unexposed portion of the flexographic printing plate precursor by the development using the washing solution.

2. The conveying type washing device according to claim 1, further comprising, on a downstream side of the development unit, a rinsing unit that supplies the development fatigue liquid processed by the separation membrane to a front surface of the flexographic printing plate precursor.

3. The conveying type washing device according to claim 2, wherein the washing solution is an aqueous developer.

4. The conveying type washing device according to claim 2, wherein the conveying unit adopts at least one of a belt conveying system, a roller conveying system, a gear conveying system, or a guide conveying system.

5. The conveying type washing device according to claim 1, wherein the washing solution is an aqueous developer.

6. The conveying type washing device according to claim 1, wherein the conveying unit adopts at least one of a belt conveying system, a roller conveying system, a gear conveying system, or a guide conveying system.

7. The conveying type washing device according to claim 1, wherein the brush is a flat brush, and the brush is arranged to be entirely immersed in the washing solution.

8. A conveying type washing device that develops a flexographic printing plate precursor after imagewise exposure using a washing solution, the device comprising:
a conveying unit that conveys the flexographic printing plate precursor through a conveying path including a curved conveying path; and
a development unit that develops the flexographic printing plate precursor in a state in which the flexographic printing plate precursor is immersed in the washing solution by the conveying unit and conveyed,
wherein the development unit has a brush used for development and a support that is provided at a position opposite to the brush with the flexographic printing plate precursor interposed therebetween and supports the flexographic printing plate precursor, and
wherein the brush is arranged in the washing solution and is movable in parallel relative to the flexographic printing plate precursor, and the development is performed by removing an unexposed portion of the flexographic printing plate precursor by the brush.

9. The conveying type washing device according to claim 8,
wherein the washing solution is an aqueous developer.

10. The conveying type washing device according to claim 8,
wherein the conveying unit adopts at least one of a belt conveying system, a roller conveying system, a gear conveying system, or a guide conveying system.

11. The conveying type washing device according to claim 8, further comprising:
a processing unit that removes solids that are generated by removing an unexposed portion of the flexographic printing plate precursor by the development using the washing solution in a development fatigue liquid including the solids.

12. The conveying type washing device according to claim 11,
wherein the processing unit has at least one of a centrifuge or a separation membrane for removing the solids in the development fatigue liquid.

13. The conveying type washing device according to claim 12, further comprising, on a downstream side of the development unit, a rinsing unit that supplies the development fatigue liquid processed by the processing unit to a front surface of a flexographic printing plate comprising the flexographic printing plate precursor from which the unexposed portion thereof has been removed.

14. The conveying type washing device according to claim 11, further comprising, on a downstream side of the development unit, a rinsing unit that supplies the development fatigue liquid processed by the processing unit to a front surface of a flexographic printing plate comprising the flexographic printing plate precursor from which the unexposed portion thereof has been removed.

15. The conveying type washing device according to claim 8,
wherein the brush is a flat brush, and the brush is arranged to be entirely immersed in the washing solution.

* * * * *